（12） United States Patent
Hielscher et al.

(10) Patent No.: US 9,406,863 B2
(45) Date of Patent: Aug. 2, 2016

(54) DEVICE AND METHOD FOR BRACING ELECTROMECHANICAL COMPOSITE HIGH-FREQUENCY VIBRATION SYSTEMS (VFHS)

(75) Inventors: Thomas Hielscher, Stahnsdorf (DE); Harald Hielscher, Stahnsdorf (DE); Holger Hielscher, Teltow (DE)

(73) Assignee: DR. HIELSCHER GMBH, Teltow (DE)

( * ) Notice: Subject to any disclaimer, the term of this patent is extended or adjusted under 35 U.S.C. 154(b) by 420 days.

(21) Appl. No.: 13/877,367

(22) PCT Filed: Oct. 4, 2011

(86) PCT No.: PCT/EP2011/067342
§ 371 (c)(1),
(2), (4) Date: Apr. 2, 2013

(87) PCT Pub. No.: WO2012/045755
PCT Pub. Date: Apr. 12, 2012

(65) Prior Publication Data
US 2013/0200754 A1    Aug. 8, 2013

Related U.S. Application Data

(60) Provisional application No. 61/389,337, filed on Oct. 4, 2010.

(51) Int. Cl.
*H01L 41/08*    (2006.01)
*H01L 41/053*   (2006.01)
*B06B 1/06*     (2006.01)

(52) U.S. Cl.
CPC .......... *H01L 41/0536* (2013.01); *B06B 1/0611* (2013.01)

(58) Field of Classification Search
CPC .... H01L 41/0536; H01L 41/056; H01L 41/08; B06B 1/0611
USPC ......... 310/322, 311, 328, 324, 337, 336, 354; 367/167, 155
See application file for complete search history.

(56) References Cited

U.S. PATENT DOCUMENTS 3,258,738 A * 6/1966 Merchant .............. B06B 1/0618
                                                        367/155
4,287,582 A * 9/1981 Tocquet ................. G10K 11/08
                                                        367/155
4,420,826 A * 12/1983 Marshall, Jr. .......... G10K 9/121
                                                        310/337

(Continued)

FOREIGN PATENT DOCUMENTS

EP    0 243 591 A2    11/1987
GB    1 137 024 A      9/1984

(Continued)

OTHER PUBLICATIONS

Russian Office Action dated Dec. 12, 2014.

(Continued)

*Primary Examiner* — Thomas Dougherty
*Assistant Examiner* — Karen B Addison
(74) *Attorney, Agent, or Firm* — Norris McLaughlin & Marcus PA

(57) ABSTRACT

The present invention relates to an apparatus for generating electromechanical composite high-frequency oscillations includes, with a composite high-frequency oscillation system having at least one oscillation-generating element and at least one bracing element for applying pressure to the oscillation-generating element, wherein the bracing element is positioned outside of the material cross-section of at least one oscillation-generating element.

17 Claims, 6 Drawing Sheets

(56) References Cited

U.S. PATENT DOCUMENTS

| | | |
|---|---|---|
| 4,499,566 A | 2/1985 | Abbott |
| 4,764,907 A * | 8/1988 | Dahlstrom ............ G10K 9/121 310/337 |
| 5,798,599 A | 8/1998 | Harwood |
| 6,545,390 B1 | 4/2003 | Hahn et al. |
| 2006/0180386 A1 | 8/2006 | Birchak |
| 2008/0015443 A1 | 1/2008 | Hosono |
| 2008/0212408 A1 | 9/2008 | Weber |

FOREIGN PATENT DOCUMENTS

| | | |
|---|---|---|
| JP | 48-033266 U | 2/1971 |
| JP | S53-042591 | 4/1978 |
| JP | 58-031074 U | 8/1981 |
| JP | H0466301 A | 3/1992 |
| JP | H10429 A | 1/1998 |
| JP | 2004-275850 A | 10/2004 |
| SU | 1450885 B1 | 1/1989 |

OTHER PUBLICATIONS

International Search Report Dated Jan. 26, 2012, Mailed Feb. 2, 2012.
Translation of International Search Report Dated Jan. 26, 2012, Mailed Feb. 2, 2012.
Japanese Office Action dated Aug. 13, 2015.

* cited by examiner

--Prior Art--

DEVICE AND METHOD FOR BRACING ELECTROMECHANICAL COMPOSITE HIGH-FREQUENCY VIBRATION SYSTEMS (VFHS)

CROSS-REFERENCES TO RELATED APPLICATIONS

This application is the U.S. National Stage of International Application No. PCT/EP2011/067342, filed Oct. 4, 2011, which designated the United States and has been published as International Publication No. WO 2012/045755 A1 and which claims the priority of U.S. Provisional Patent Application, Ser. No. 61/389,337, filed Oct. 4, 2010, pursuant to 35 U.S.C. 119(a)-(d).

BACKGROUND OF THE INVENTION

The invention relates to an apparatus for bracing electromechanical composite high-frequency oscillation systems (VFHS).

Low-frequency high-power ultrasound (NFLUS) is ultrasound with a working frequency of 15 to 200 kHz, preferably 15 to 60 kHz, for example 20 kHz, and a sound power of 10 W, preferably from 100 W to 20,000 W, for example 10,000 W. For example, piezo-ceramic or magnetostrictive systems are used to generate the ultrasound. Linear transducers and flat or curved plate transducers or tube resonators are known in the art. Low-frequency high-power ultrasound is used, inter alia, in the treatment of liquids, such as food, cosmetics, paints and nanomaterials. For this purpose, ultrasound is transmitted in liquids via a resonator with amplitudes of 1 to 350 µm, preferably 10 to 80 µm, for example 35 µm. Lambda is the wavelength resulting from the frequency and the NFLUS sound propagation speed in the high-frequency oscillation system. A high-frequency oscillation system can be composed of one or more Lambda/2 elements. A multipart high-frequency oscillation system having several Lambda/2 elements can be made from a single piece of material of appropriate length, or of a plurality of elements having a length n*lambda/2 (n ∈ N), which are assembled for example with screws. Lambda/2 elements may have various material cross-sectional geometries, such as circular, oval or rectangular cross-sections. The cross-sectional geometry and cross-sectional area may vary along the longitudinal axis of a Lambda/2 element. The cross sectional area may be between 0.01 and 300 cm$^2$, preferably between 10 and 100 cm$^2$, for example 50 cm$^2$. Lambda/2 elements may be made, inter alia, from metal or ceramic materials or from glass, in particular from titanium, titanium alloys, steel or steel alloys, aluminum or aluminum alloys, for example from titanium grade 5. A Lambda/2 element may be manufactured from a single piece of material of appropriate length or may be made of a plurality of interconnected pieces of material.

High-frequency oscillation systems and Lambda/2 elements constructed from more than one piece of material may be joined in different ways to form a composite structure. A typical form of the composite structure is a high-frequency oscillation system that is compressed using a bracing element positioned in the center (FIG. 1). Piezo-ceramic composite high-frequency oscillation systems are composed of one or more Lambda/2 elements connected in the longitudinal direction, of which at least one Lambda/2 element has one or more piezoelectric ceramic elements, for example, disks, rings, disk segments or ring segments. Composite high-frequency oscillation systems with several piezo-ceramic elements, preferably with more than four piezo-ceramic elements, for example with eight piezo-ceramic elements, are used for low-frequency high-performance systems.

In particular, piezo-ceramic composite high-frequency oscillation systems require an increased surface pressure of the piezo-ceramic elements. This surface pressure may be between N 0.1 and 1000 N/mm$^2$, preferably between 40 and 300 N/mm$^2$, for example 100 N/mm$^2$. The surface pressure has a significant effect on the efficiency, the maximum attainable ultrasonic power and the resonance frequency. Therefore, the surface pressure can be selected, inter alia, so as to maximize the efficiency and/or to minimize the thermal losses in the conversion of electrical energy into mechanical energy.

The surface pressure is produced by at least one bracing element, for example by a centrally positioned bracing screw.

Tensile loading of the bracing elements is produced which depends on the applied surface pressure. The tensile loading capacity of the individual bracing elements requires a minimum required sum of the material cross sections of the individual bracing elements. In the case of internal, e.g. centrally arranged bracing elements, the material cross-section of the bracing elements reduces the material cross-section of the ultra-sound-generating elements, e.g. the piezo-ceramic elements. The maximum diagonal length and thus the maximum attainable cross-sectional area of the ultra-sound-generating elements, such as the piezo-ceramic elements, are limited by the structure because with increasing length of the diagonal, both the tendency for destructive bending oscillations, for example of the piezo elements and pieces of material, increases and the heat dissipation increases due to an increased average distance to the uncovered surface of the ultra-sound-generating elements. Since the cross-sectional area of the ultra-sound-generating elements can thus not be chosen to be arbitrarily large, reducing the bracing elements, the required material cross-section of the bracing elements reduces the maximum possible cross-sectional area of the ultra-sound-generating elements.

SUMMARY OF THE INVENTION

It is therefore the object of the invention to provide an apparatus with which electromechanical composite high-frequency oscillation systems can be braced, without reducing the material cross-section of the ultra-sound-generating elements.

According to the invention, this object is attained by the features of claim 1. Advantageous embodiments are the subject matter of the dependent claims.

According to the invention, an apparatus for producing electromechanical composite high-frequency oscillations is provided which includes a composite high-frequency oscillation system that includes at least one oscillation-generating element and at least one bracing element for applying pressure to the oscillation generating element, wherein at least one bracing element is positioned outside of the material cross-section of at least one oscillation-generating element.

In this way, internal, e.g. centrally arranged bracing elements, which are limited in their maximum cross-sectional geometry by the surrounding ultra sound-generating elements and which tend to form bending oscillations, can be eliminated. The high aspect ratio (length to cross-sectional diagonal) of the bracing element(s) produces a high tendency for bending oscillations, in particular with piezo-ceramic composite high-frequency oscillation systems composed of several Lambda/2 elements connected in the longitudinal direction and internal, e.g. centrally arranged bracing elements,. These bending oscillations can be eliminated or at least significantly reduced with the design according to the invention by using externally mounted bracing elements.

In an advantageous embodiment of the invention, at least two bracing elements are positioned outside of the material cross-section of at least one oscillation-generating element.

The generated oscillations are preferably ultrasound.

The composite high-frequency oscillation system is configured to oscillate at a frequency between 15 and 200 kHz, in particular between 15 and 60 kHz, and in a preferred embodiment between 15 and 35 kHz.

Furthermore, the composite high-frequency oscillation system is configured to generate oscillations with an amplitude of 1 to 350 µm, and in particular an amplitude of 10 to 80 µm.

The composite high-frequency oscillation system is herein configured to transmit ultrasound with a power of 100 to 20,000 watts, in particular with a power of 4,000 to 20,000 watts.

Advantageously, the oscillation-generating elements are piezo-ceramic elements.

In other words, the composite high-frequency oscillation system can use in particular piezo-ceramic elements for generating the oscillations.

The piezo-ceramic elements may be piezo-ceramic disks or disk segments.

Alternatively, the composite high-frequency oscillation system may use piezo-ceramic rings or ring segments for generating the oscillations.

The composite high-frequency oscillation system may use piezo-ceramic elements with a diagonal of more than 30 mm, in particular of more than 50 mm, and in a particularly preferred embodiment of more than 70 mm, for generating the oscillations.

The composite high-frequency oscillation system is particularly configured for transmitting ultrasound in liquids.

The composite high-frequency oscillation system is primarily configured for continuous operation and in particular for operating with a constant amplitude or a constant load for longer than one hour.

In an advantageous embodiment of the invention, the composite high-frequency oscillation system has at least two, in particular at least three, Lambda/2 elements that are successively arranged along its longitudinal direction.

Here, at least two Lambda/2 elements may each have at least one piezoelectric element.

Alternatively, at least two Lambda/2 elements may each have at least two piezoelectric elements.

Preferably the surface pressure applied to the piezo-ceramic elements is at least at one location between 0.1 and 1000 N/mm$^2$, in particular between 40 and 300 N/mm$^2$.

Generally, the surface pressure applied to the piezo-ceramic elements should be selected so as to reduce the thermal losses when converting electrical energy into mechanical energy.

In one embodiment of the apparatus according to the invention, at least two bracing elements positioned on the outside may be used.

The sum of the cross-sectional minima of the employed bracing elements should be more than 50 mm$^2$, in particular more than 250 mm$^2$.

At least one bracing element may at least partially or for the most part enclose the composite high-frequency oscillation system. To this end, this bracing element may have a ring-shaped or ring-segment-shaped cross section, so that this bracing element partially or completely encloses the composite high-frequency oscillation system.

At least one bracing element may be braced, for example screwed together, with at least one thread.

The tensile stress of the bracing element should be below the plastic deformation limit. In other words, the tensile stress introduced by tensioning the bracing element should be less than the yield limit Re of the bracing element.

At least one bracing member may have elasticity capable of compensating for tolerances.

At least one bracing element may be used for bracing an additional composite high-frequency oscillating system. In other words, the apparatus according to the invention may have a plurality of composite high-frequency oscillation systems, and at least one bracing element may be used for bracing several composite high-frequency oscillation systems.

Preferably, the force may be transmitted from at least one bracing element to the composite high-frequency oscillation system near or in the immediate vicinity of or directly at a minimum (node) of the mechanical oscillations that occur in the longitudinal direction of the composite high-frequency oscillation system.

Alternatively, the force may be transmitted from at least one bracing element to the composite high-frequency oscillation system at a distance of less than 0.1 lambda to a minimum (node) of the mechanical oscillations that occur in the longitudinal direction of the composite high-frequency oscillation system.

The force may be transmitted from at least one bracing element to the composite high-frequency oscillation system at least at one end of the bracing element which makes contact outside the composite high-frequency oscillation system, especially by applying pressure to an end of a piece of material.

Alternatively, the force may be transmitted from at least one bracing element to the composite high-frequency oscillation system via at least one coupling element.

Preferably at least one oscillation-decoupling, absorbing and/or damping geometry is used to reduce the oscillations transmitted from the composite high-frequency oscillation system to at least one bracing element.

Furthermore, the resonance frequency of the bracing element may advantageously differ from the excitation frequency of the composite high-frequency oscillating system. This means that at least one bracing element lacks a resonance frequency that is located close to the excitation frequency of the composite high-frequency oscillating system.

When using several bracing elements, at least two bracing elements should have mutually different resonance frequencies.

At least one bracing element may be electrically insulating or insulated.

Furthermore, at least one bracing element, or at least one coupling element, may be used for conducting heat or thermal energy, for example for dissipating heat or for transporting heating/cooling fluids, such as oil, water or compressed air.

Especially for this purpose, an oscillation-generating or ultra-sound-generating element may have openings for passing heat-dissipating materials, such as liquids or gases.

The apparatus according to the invention may be produced by positioning at least one bracing element outside the material cross-section of at least one oscillation-generating element, where it can be braced so as to apply a tension to the oscillation-generating element.

By positioning one or more bracing elements outside the material cross section of the ultra-sound-generating elements, i.e. the piezo-ceramic elements, according to the invention, the sum of the material cross-sections of the bracing elements may not or not significantly reduce the material cross section of the ultra-sound-generating elements, e.g. the piezo-ceramic elements. Moreover, the sum of the material cross-sections of the bracing elements is not limited by the geometry of the ultra-sound-generating elements.

For this purpose, one or more bracing elements are positioned outside of the material cross-section of the ultra-sound-generating elements. Bracing elements with a large sum of minimum bracing element material cross-sections of the bracing elements may then be used, wherein the sum may be greater than 50 mm$^2$, preferably greater than 250 mm$^2$, for example 600 mm$^2$.

The bracing elements may be manufactured, inter alia, from metallic, non-metallic or ceramic materials, or from plastics or composite materials, in particular from titanium, titanium alloys, steel or steel alloys, aluminum, polymers, high-performance plastics, or aluminum alloys, for example from titanium grade 5. Bracing elements composed of more than a single piece of material may be joined in various ways to form a composite, for example with screws, hooks, adhesive, knots, by twisting, weaving, shrinking or pressing. The cross-sectional geometry of the individual bracing elements may vary along the longitudinal direction of the composite high-frequency oscillating system. For example, circular, semi-circular, circular segment-shaped, rectangular (e.g. square), hexagonal, annular (e.g. tube) and ring segment-shaped or polygenic cross-sectional geometries (e.g., cable) are feasible. The cross-sectional geometry of one or more bracing elements may partially, for the most part or completely enclose the composite high-frequency oscillation system.

The tensile stress applied to the bracing elements may be generated, for example, by a screw connection, thermal contraction during cooling, thermal expansion, chemical interference or with levers, hydraulic cylinders, piezo actuators, springs, gears, or inclined planes, preferably by screwing. These devices for applying the tensile stress may be attached on one side, on both sides or on several sides, for example, on one or more bracing elements.

The tensile stress of the bracing elements should preferably be below the limit for plastic deformation or cracking. The bracing elements can deform elastically under the effect of the tensile stress, e.g. expand in the pull direction. This elasticity can compensate for tolerances.

The bracing elements can deform, for example expand in the pull direction, when exposed to thermal effects, e.g. during the operation of the composite high-frequency oscillating system. This deformation may cause a variation in the tensile stress. This variation of the tensile stress can be used to intentionally control the surface pressure and surface pressure distribution applied to the composite high-frequency oscillation system. The arrangement of externally positioned bracing elements may be selected and combined, for example, with internal bracing elements, so as to produce an optimal evenly distributed surface pressure and surface pressure distribution that is applied to the composite high-frequency oscillation system along the cross-section.

Individual bracing elements may be used for bracing more than one composite high-frequency oscillating system.

Force transmission from one bracing element to the composite high-frequency oscillation system may occur at any location. Preferably, the force should be transmitted near or in the immediate vicinity of a minimum (node) of the mechanical oscillations that occur in the longitudinal direction of the composite high-frequency oscillation system. The distance of the mechanical oscillations that occur in the longitudinal direction of the composite high-frequency oscillation system from such a minimum may be, for example, between 0 and 0.2 Lambda, preferably 0 to 0.1 Lambda, for example 0.02 Lambda.

The transmission may take place, for example, via coupling elements that make contact on the outside of the composite high-frequency oscillation system or that press against the ends of a Lambda/2 element. To reduce the mechanical oscillations transmitted by the composite high-frequency oscillation system to the bracing elements, these coupling elements or the bracing elements themselves may have oscillation-decoupling, -absorbing or -attenuating components or geometries. These components may be made, inter alia, from plastics, composite materials, resins or metals, for example from rubber.

When transmission of mechanical oscillations from the composite high-frequency oscillation system to the bracing elements can not be completely eliminated, the bracing elements should preferably lack resonance frequencies located close to the excitation frequency of the composite high-frequency oscillating system. The resonance frequencies of the bracing elements may be affected, inter alia, by the geometry, such as the length, the material selection, and by the arrangement of the coupling point or coupling elements. The individual bracing elements may be different from one another, and may thus have, for example, mutually different resonance frequencies for bending oscillations.

To reduce or eliminate transmission of electric voltages from the composite high-frequency oscillation system to the bracing elements, the coupling elements or the bracing elements themselves may have electrically insulating components. These components may be made, inter alia, from plastics, composite materials, resins, ceramics, concrete, glass, for example from concrete.

Alternatively, the bracing elements and/or the coupling elements may be used with a suitable design as conductors for transmitting electrical energy, for example as a protective conductor, for conducting thermal energy, for example for heat dissipation or for transporting heating/cooling fluids, such as oil, water or compressed air.

Openings for conducting heat-dissipating materials, such as liquids or gases, for example oil, water, air or an inert gas, may be positioned within the material cross section of the ultrasound-generating elements. These materials may be moved at or exposed to a pressure different from ambient pressure, for example an overpressure. The contact surfaces between these materials and the composite high-frequency oscillation system may be used to transfer thermal energy, for example for cooling.

BRIEF DESCRIPTION OF THE DRAWING

The invention will now be described in more detail with reference to the exemplary embodiments illustrated in the appended FIGS. 2 to 6. The accompanying drawings which show in: the following.

DETAILED DESCRIPTION OF PREFERRED EMBODIMENTS

Figure 1:
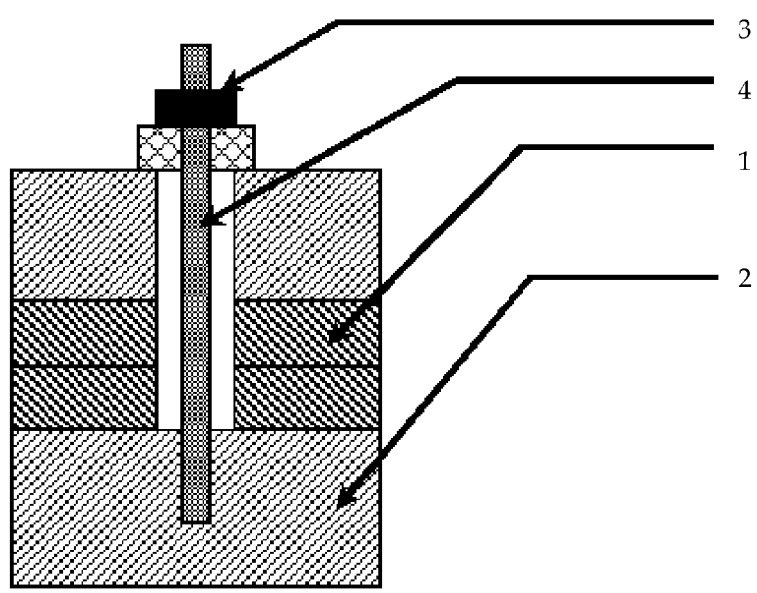
FIG. 1 shows a conventional composite high-frequency oscillation system with a bracing element positioned in the center.
Figure 2:
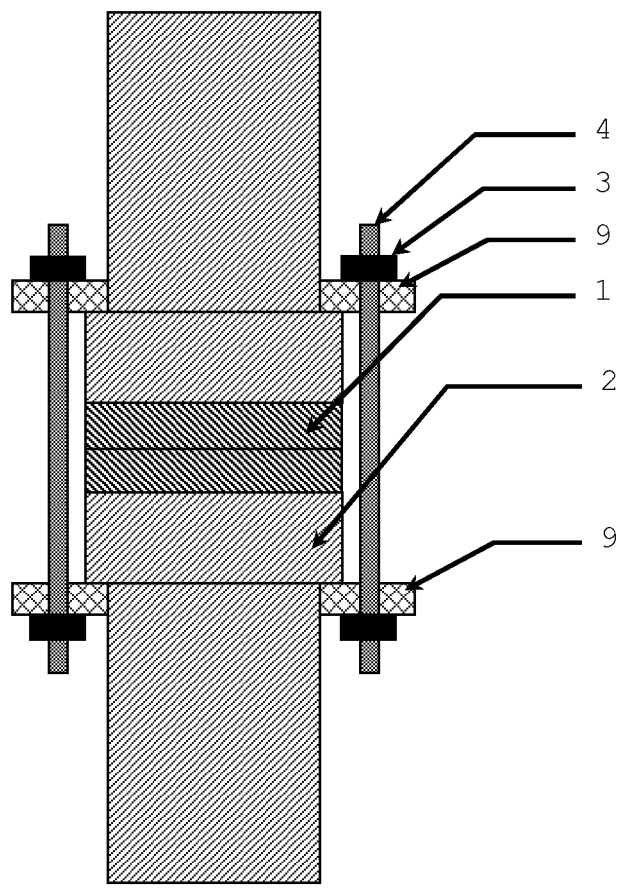
FIG. 2 shows a first embodiment of an apparatus according to the present invention.

FIG. 2 shows a type of an apparatus according to the invention. A composite high-frequency oscillation system includes a Lambda/2 element having two piezo-ceramic disks (1) disposed between two pieces of material (2). These pieces of material (2) are braced with two bracing elements (4) and two coupling elements (9) contacting the outside of the two pieces of material (2). The bracing elements (4) are positioned outside the cross-sectional geometry of the piezo-ceramic disks (1). The tension force is applied to the bracing elements by twisting nuts (3).

Figure 3:
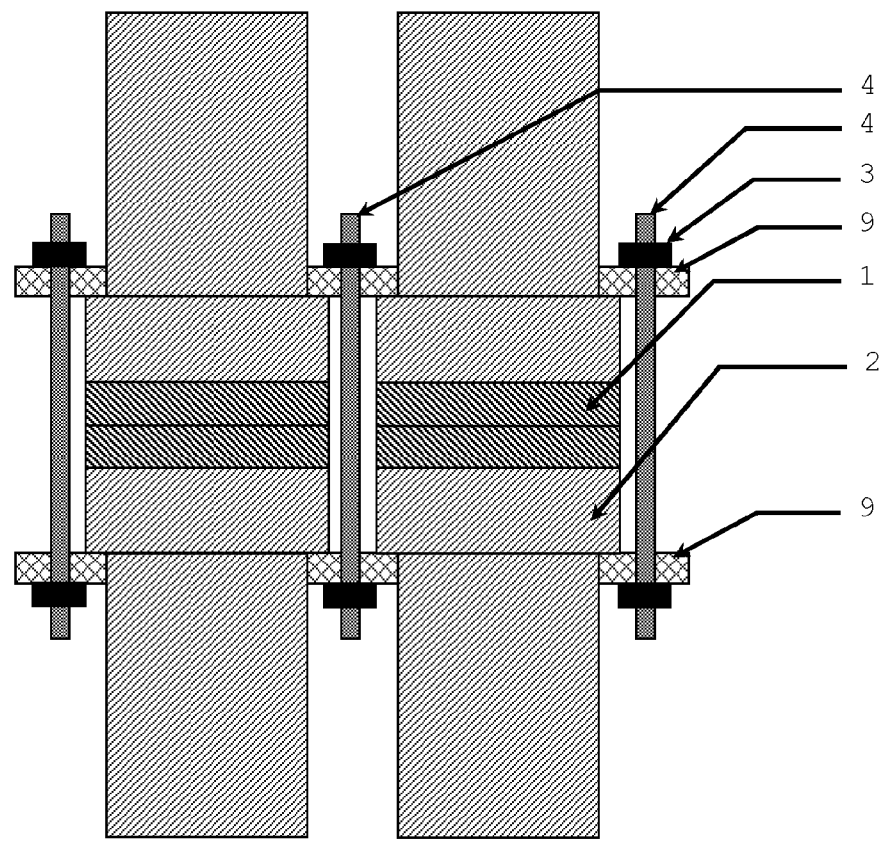
FIG. 3 shows a second embodiment of an apparatus according to the present invention.

FIG. 3 shows a similar embodiment as FIG. 2, but this time with two composite high-frequency transducer systems arranged in parallel. One of the bracing elements (4) is used to tension both composite high-frequency oscillation systems.

Figure 4:
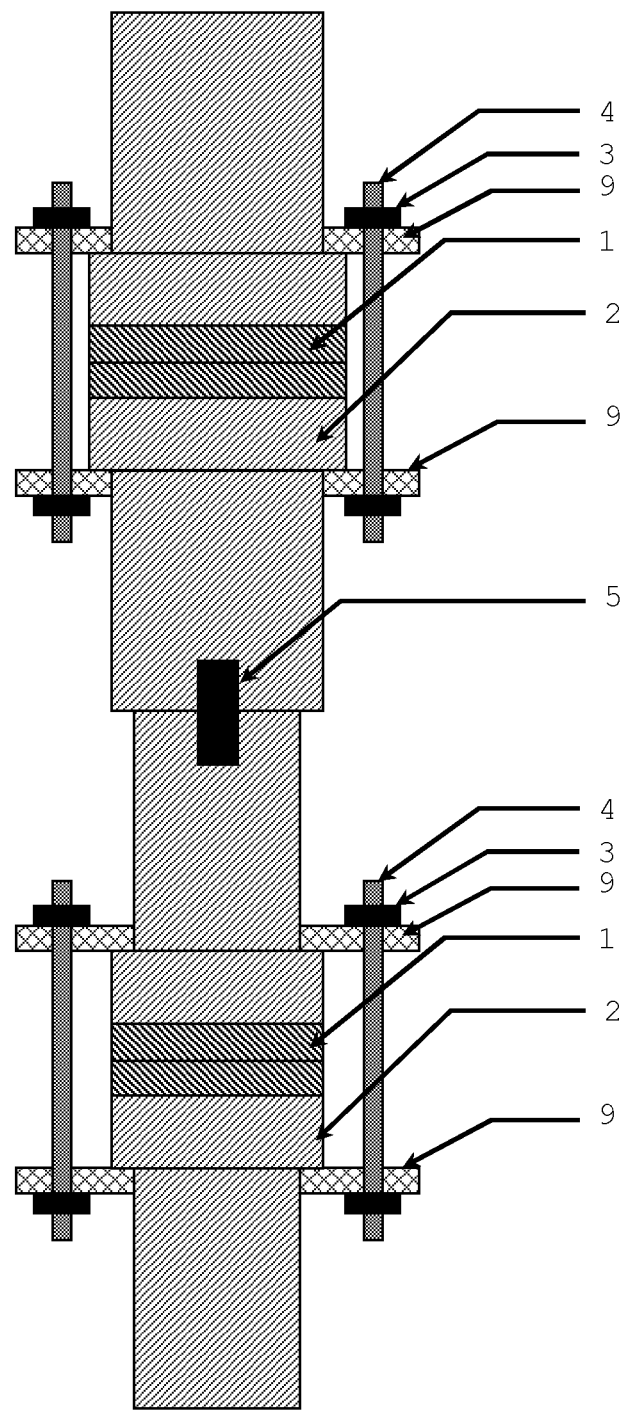
FIG. 4 shows a third embodiment of an apparatus according to the present invention.

FIG. 4 shows a variant similar to FIG. 2, but here with two Lambda/2 elements that are connected in the longitudinal direction by threaded bolts (5), with each Lambda/2 element having two piezo-ceramic plates (1).

Figure 5:
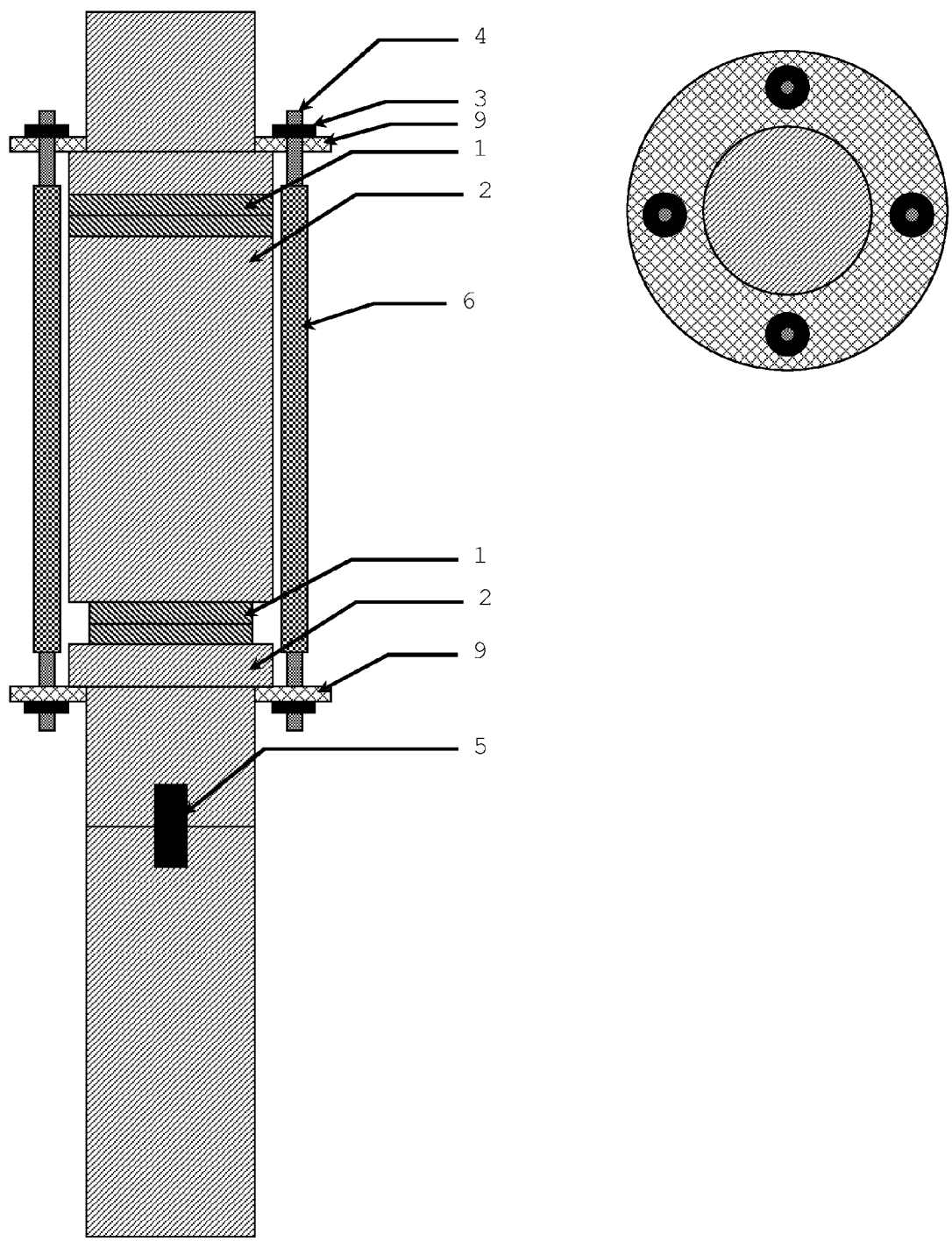
FIG. 5 shows a fourth embodiment of an apparatus according to the present invention.

FIG. 5 shows a variant similar to FIG. 2, but here with two Lambda/2 elements that are connected in the longitudinal direction via a common piece of material (8) and with an additional Lambda/2 element that is connected by threaded bolts (5) without piezo-ceramic disks. Each of the 4 bracing elements (4) has a connecting tube (6).

Figure 6:
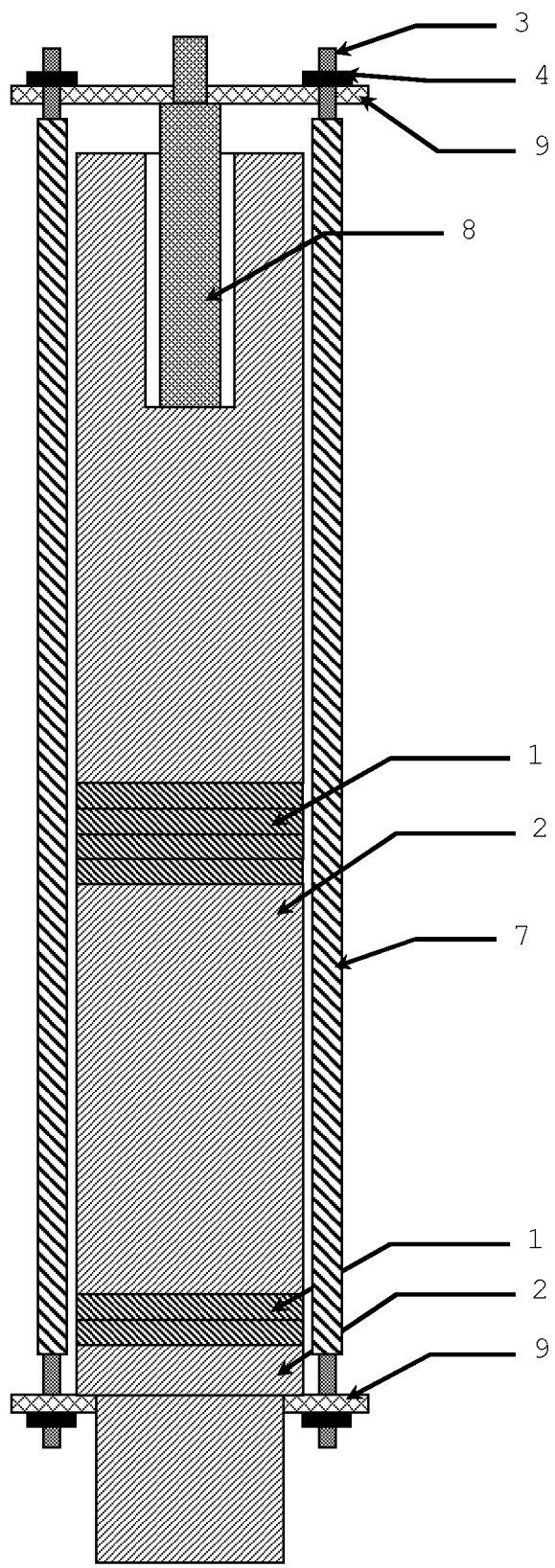
FIG. 6 shows a fifth embodiment of an apparatus according to the present invention.

FIG. 6 shows a similar variation as FIG. 2, but this time with two Lambda/2 elements that are connected in the longitudinal direction by a common piece of material (8). Each of the bracing elements (4) has an insulation (7). An additional coupling element (pressure element) (10) is used for transmitting a force to the VHFS high-frequency oscillation system. All variants have in common that the bracing elements (4) are positioned outside the ultra-sound-generating elements (1).

FIG. 6 shows three rotationally symmetric Lambda/2 elements that are connected in the longitudinal direction. The material pieces (2 and 8) are made, for example, from titanium grade 5. The diameter of the piezo-ceramic elements (1) is for example 80 mm. Two bracing elements (3) are made from a steel alloy and have an external thread, for example M6. The length of each of the bracing elements (3) is, for example, 360 mm. A portion of the length of the bracing elements is covered by the insulation (7). The coupling elements (9) are made from aluminum. The coupling piece (pressure piece) (8) transmits a bracing force of 500 kN to the Lambda/2 element. The position of the force transmission is selected so as to be located close to the oscillation minimum of the longitudinal oscillations of the upper Lambda/2 element. The excitation frequency of the composite high-frequency system is 19 kHz and configured for transmitting of ultrasound with a power of up to 4 kW in continuous operation.

LIST OF REFERENCE SYMBOLS

1 Ultra-sound-generating element
2 Piece of material
3 Nut (internal thread)
4 Bracing element with external thread
5 Threaded bolts
6 Connecting tube with internal thread
7 Insulation
8 Piece of material
9 Coupling element
10 Coupling element (pressure element)

The invention claimed is:

1. An apparatus for generating electro-mechanical composite composite high-frequency oscillations, comprising a composite high-frequency oscillation system with at least one oscillation-generating element and at least one bracing element for applying pressure to the oscillation-generating element,
   wherein at least one bracing element is positioned outside of the material cross-section of at least one oscillation-generating element, and
   a force is transmitted from the at least one bracing element to the composite high-frequency oscillation system at a distance of less than 0.1 lambda from a minimum (node) of the mechanical oscillations that occur in a longitudinal direction of the composite high-frequency oscillation system.

2. The apparatus of claim 1, wherein at least two bracing elements are positioned outside of the material cross-section of at least one oscillation-generating element.

3. The apparatus of claim 1, wherein the composite high-frequency oscillation system is configured to oscillate at a frequency between 15 kHz and 200 kHz.

4. The apparatus of claim 1, wherein the composite high-frequency oscillation system is configured to generate oscillations with an amplitude from 1 μm to 350 μm.

5. The apparatus of claim 1, wherein the oscillation-generating elements are piezo-ceramic elements.

6. The apparatus of claim 1, wherein the composite high-frequency oscillation system comprises at least two Lambda/2 elements that are consecutively arranged along its longitudinal direction.

7. The apparatus of claim 1, wherein at least one bracing element at least partially encompasses the composite high-frequency oscillation system.

8. The apparatus of claim 1, wherein at least one bracing element is tensioned by at least one thread.

9. The apparatus of claim 1, wherein a tensile stress in the at least one bracing element is less than a plastic deformation limit of the at least one bracing element.

10. The apparatus of claim 1, wherein a force is transmitted from the bracing element to the composite high-frequency oscillation system at a minimum (node) of the mechanical oscillations that occur in a longitudinal direction of the composite high-frequency oscillation system.

11. The apparatus of claim 1, wherein a force is transmitted from the at least one bracing element to the composite high-frequency oscillation system on at least one end of the bracing element by pressing against a piece of material.

12. The apparatus of claim 1, wherein a force is transmitted from the at least one bracing element to the composite high-frequency oscillation system via at least one coupling element.

13. The apparatus of claim 1, wherein a resonant frequency of the at least one bracing element differs from an excitation frequency of the composite high-frequency oscillation system.

14. The apparatus of claim 1, wherein at least two bracing elements have mutually different resonance frequencies.

15. The apparatus of claim 1, wherein at least one bracing element or at least one coupling element, or both, are constructed to conduct heat.

16. The apparatus of claim 1, wherein at least one oscillation-generating element comprises openings for passing heat-conducting materials.

17. The apparatus of claim 8, wherein the at least one bracing element is tensioned with a screw.

\* \* \* \* \*